(12) United States Patent
Kim et al.

(10) Patent No.: US 10,037,938 B2
(45) Date of Patent: Jul. 31, 2018

(54) SEMICONDUCTOR PACKAGES

(71) Applicants: Keung Beum Kim, Hwaseong-si (KR);
Hyunjong Moon, Seoul (KR);
Seung-Yong Cha, Hwaseong-si (KR)

(72) Inventors: Keung Beum Kim, Hwaseong-si (KR);
Hyunjong Moon, Seoul (KR);
Seung-Yong Cha, Hwaseong-si (KR)

(73) Assignee: Samsung Electronics Co., Ltd.,
Suwon-si, Gyeonggi-do (KR)

( * ) Notice: Subject to any disclaimer, the term of this patent is extended or adjusted under 35 U.S.C. 154(b) by 0 days.

(21) Appl. No.: 15/499,233

(22) Filed: Apr. 27, 2017

(65) Prior Publication Data
US 2018/0122772 A1    May 3, 2018

(30) Foreign Application Priority Data
Oct. 31, 2016    (KR) ........................ 10-2016-0143499

(51) Int. Cl.
*H01L 23/538*    (2006.01)
*H01L 25/10*    (2006.01)
(Continued)

(52) U.S. Cl.
CPC ...... *H01L 23/5227* (2013.01); *H01L 23/3128* (2013.01); *H01L 23/49827* (2013.01); *H01L 23/49838* (2013.01); *H01L 24/09* (2013.01); *H01L 24/46* (2013.01); *H01L 25/105* (2013.01); *H01L 25/117* (2013.01); *H01L 25/50* (2013.01); *H01L 2224/0401* (2013.01); *H01L 2224/14131* (2013.01); *H01L 2224/48091* (2013.01);
(Continued)

(58) Field of Classification Search
CPC .. H01L 23/5227; H01L 25/112; H01L 25/117;
H01L 2225/1011; H01L 2225/1017; H01L
2225/1023; H01L 2225/1047; H01L
2225/107; H05K 2201/10378
See application file for complete search history.

(56) References Cited

U.S. PATENT DOCUMENTS 7,902,679 B2    3/2011    Lin et al.
8,907,756 B2    12/2014    Sainz
(Continued)

FOREIGN PATENT DOCUMENTS

KR    10-2013-0015678 A    2/2013

*Primary Examiner* — Julio J Maldonado
*Assistant Examiner* — Molly Reida
(74) *Attorney, Agent, or Firm* — Volentine, Whitt & Francos, PLLC

(57) ABSTRACT

A semiconductor package includes a first package and a second package stacked on the first package. The first package includes a redistribution substrate, a first semiconductor chip on the redistribution substrate, a connection substrate provided on the redistribution substrate to surround the first semiconductor chip as viewed in plan, and an inductor structure provided within a first region of the connection substrate and electrically connected to the first semiconductor chip through the redistribution substrate. The second package includes at least one outer terminal electrically connected to the first package. The outer terminal is provided on a second region of the connection substrate, and when viewed in plan, the first region and the second region are spaced apart from each other.

20 Claims, 16 Drawing Sheets

(51) Int. Cl.
    *H01L 23/522*    (2006.01)
    *H01L 23/498*    (2006.01)
    *H01L 23/31*     (2006.01)
    *H01L 23/00*     (2006.01)
    *H01L 25/00*     (2006.01)
    *H01L 25/11*     (2006.01)

(52) U.S. Cl.
    CPC   *H01L 2225/0652* (2013.01); *H01L 2225/107* (2013.01); *H01L 2225/1017* (2013.01); *H05K 2201/10378* (2013.01)

(56) References Cited

U.S. PATENT DOCUMENTS

| | | |
|---|---|---|
| 9,190,297 B2 | 11/2015 | Choi et al. |
| 9,349,692 B2 | 5/2016 | Pan et al. |
| 9,583,433 B2 * | 2/2017 | Song .................. H01L 23/5227 |
| 2011/0090651 A1 * | 4/2011 | Jung .................. H03H 9/0514 |
| | | 361/748 |
| 2014/0097513 A1 | 4/2014 | Lee |
| 2014/0217547 A1 | 8/2014 | Elsherbini et al. |
| 2015/0042400 A1 | 2/2015 | Sturcken et al. |
| 2015/0054573 A1 | 2/2015 | Zhou et al. |
| 2015/0235995 A1 | 8/2015 | Park et al. |
| 2016/0095225 A1 * | 3/2016 | Fazelpour .......... H01L 23/5227 |
| | | 361/761 |
| 2016/0133614 A1 * | 5/2016 | Gu .................. H01L 23/295 |
| | | 257/773 |
| 2016/0190113 A1 | 6/2016 | Sharan et al. |
| 2016/0247761 A1 * | 8/2016 | Song .................. H01L 23/5227 |

* cited by examiner

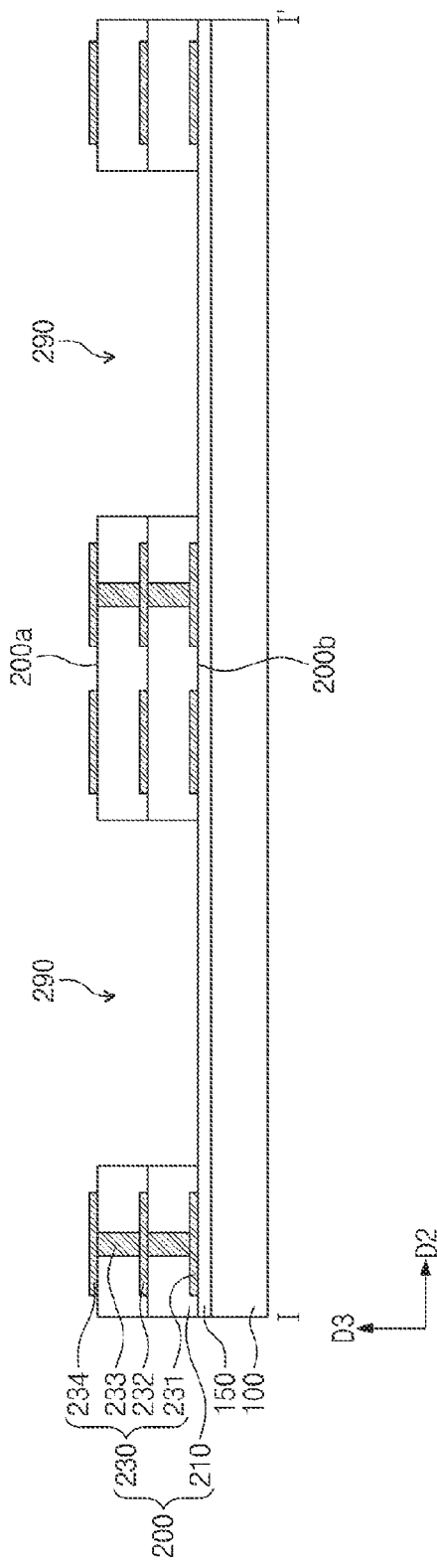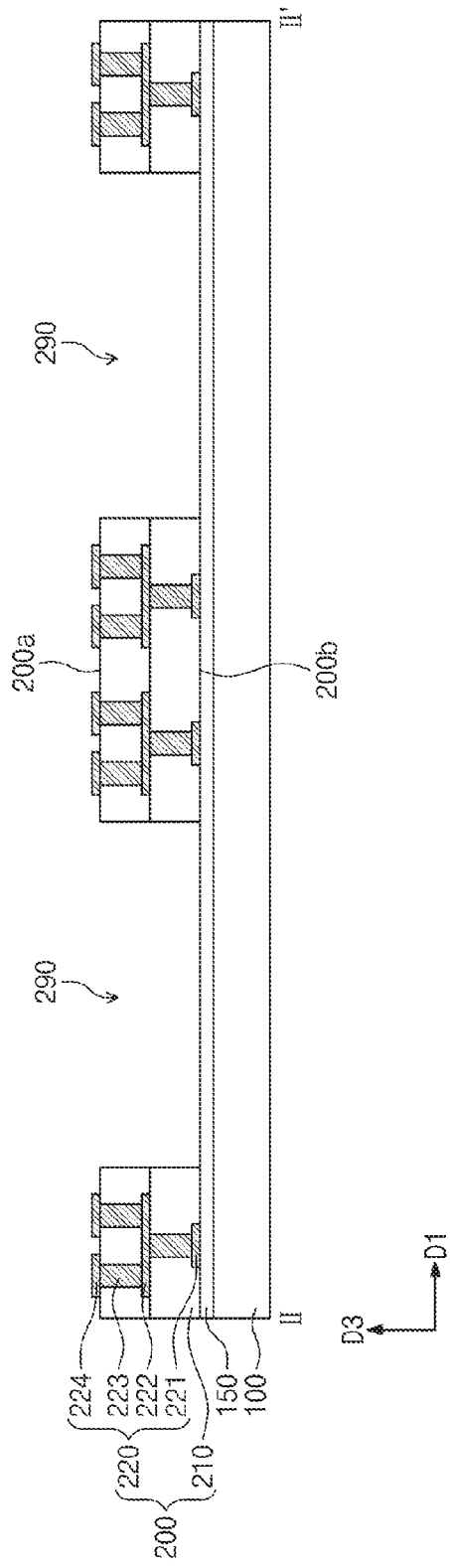

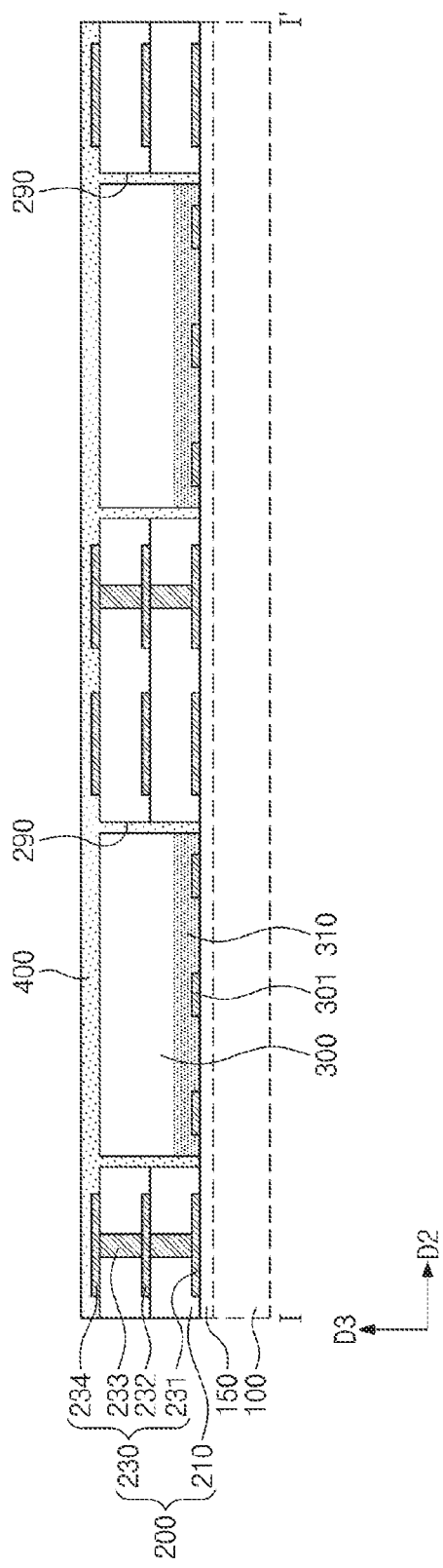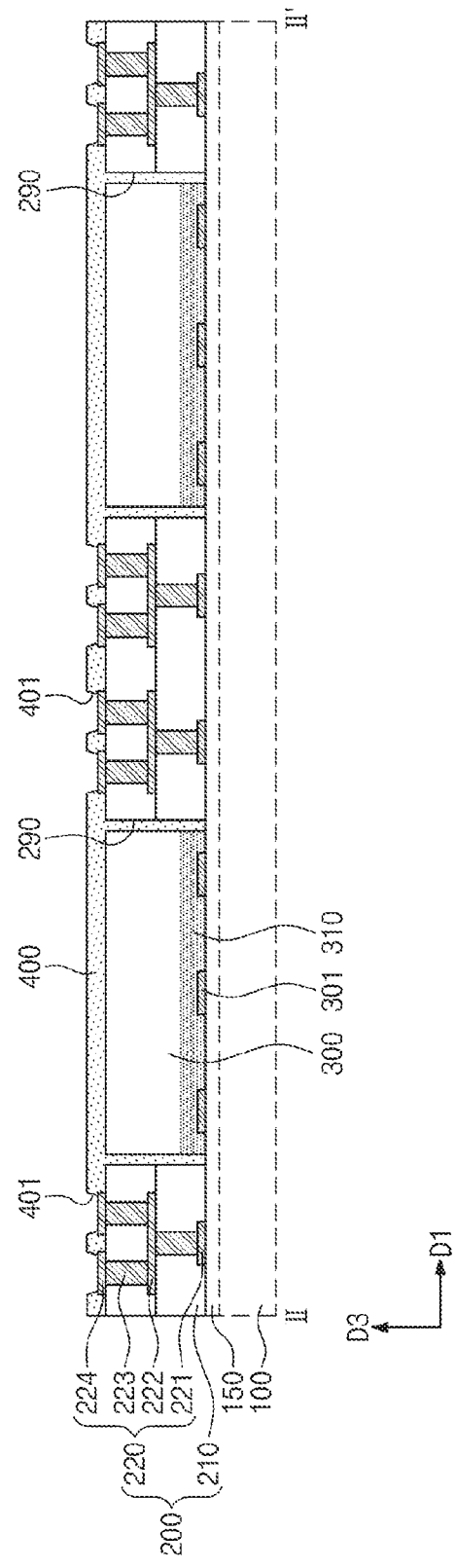

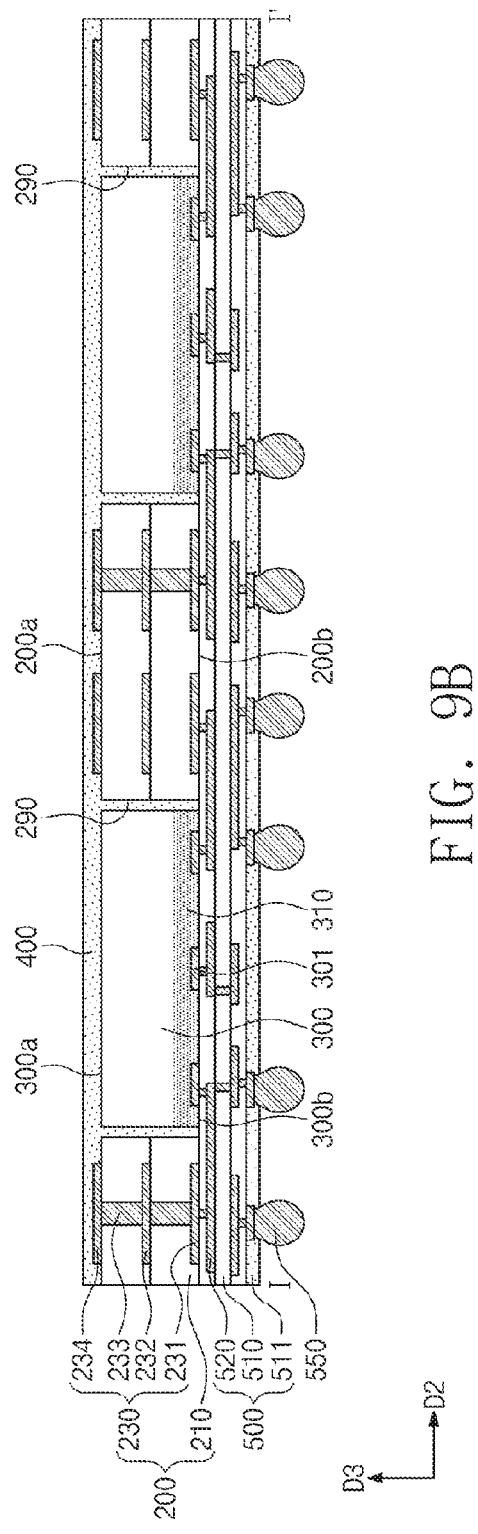
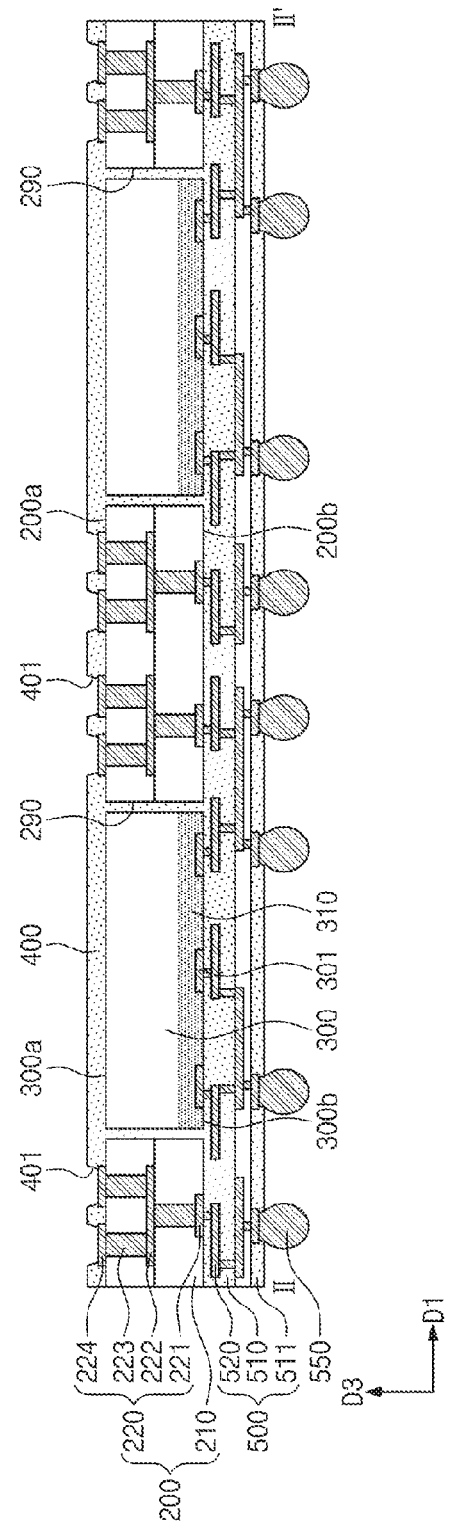

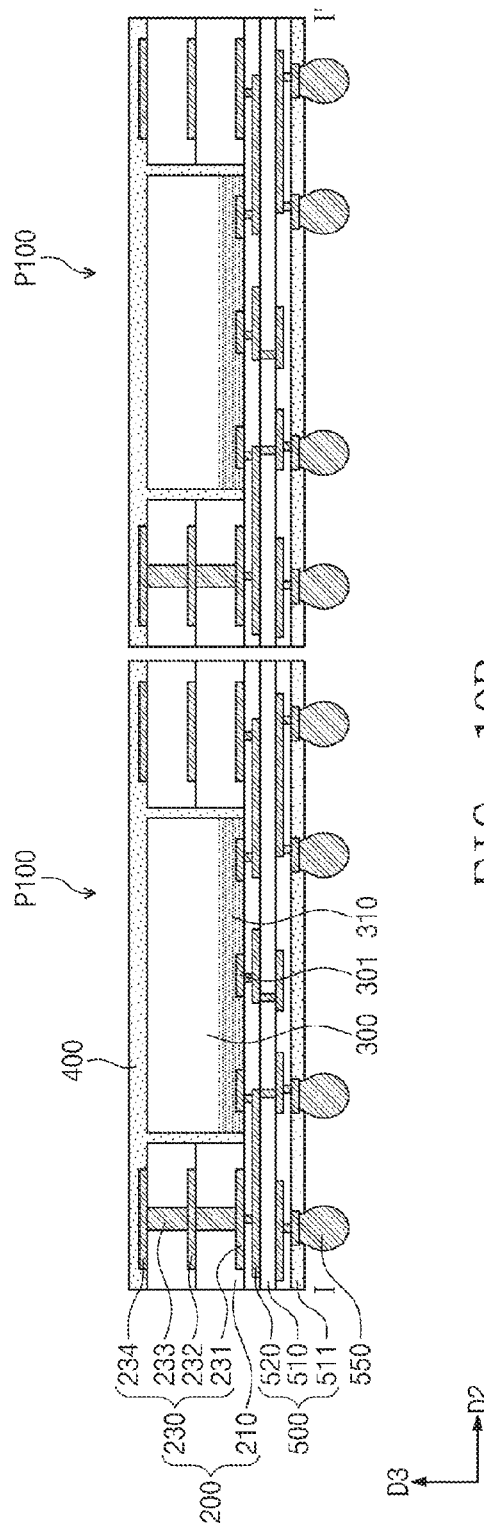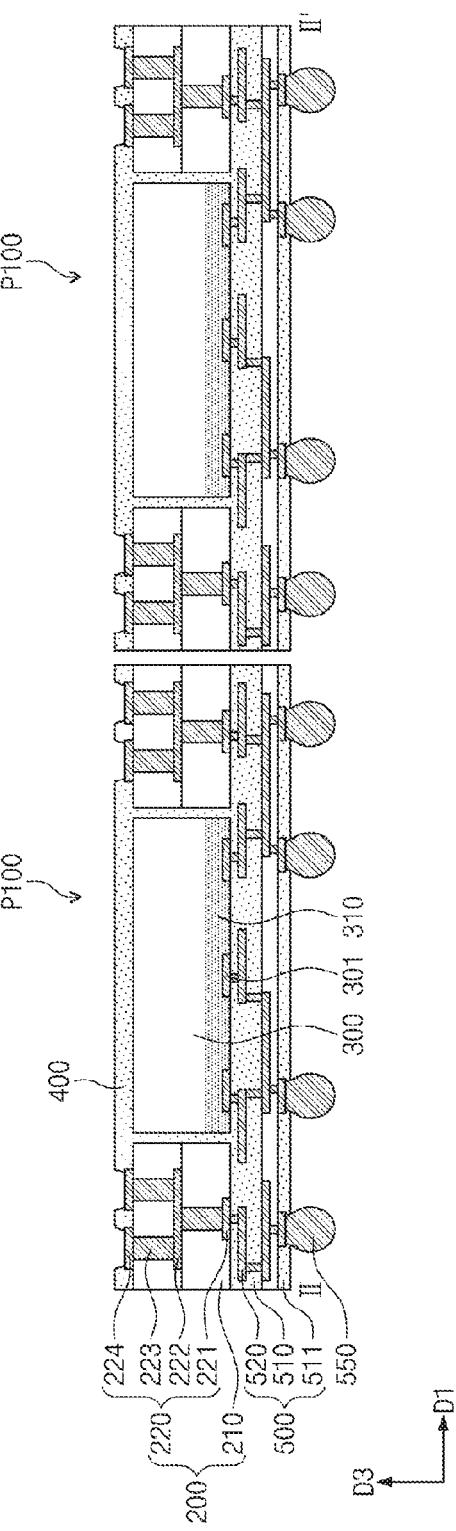

SEMICONDUCTOR PACKAGES

PRIORITY STATEMENT

This U.S. non-provisional patent application claims priority under 35 U.S.C. § 119 to Korean Patent Application No. 10-2016-0143499, filed on Oct. 31, 2016, in the Korean Intellectual Property Office, the entire contents of which are hereby incorporated by reference.

BACKGROUND

The inventive concept relates to semiconductor packages and to package on package (PoP) semiconductor devices.

In the semiconductor industry, various package technologies have been developed to meet demands for semiconductor devices and/or electronic appliances that can store large amounts of information and which are thin and/or otherwise compact. Typical of many of these package technologies is a semiconductor package which includes a printed circuit board (PCB) and an integrated circuit (IC) chip provided on and electrically connected to the PCB through bonding wires or bumps. The integrated circuit (IC) chip is usually embedded in a molding compound on the PCB. These technologies allow the IC chip to be readily used as one part of a control system of an electronic product. As the semiconductor industry matures, there is demand for semiconductor packages which have higher degrees of functionality so that the performance and operation speed of electronic products can be increased while the products remain relatively compact. Thus, there is a demand for packaging technologies which incorporate greater numbers of IC chips within a minimum footprint and/or thickness.

SUMMARY

According to an aspect of the inventive concept, there is provided a semiconductor device comprising: a first package and a second package stacked on the first package, and wherein the first package includes a redistribution substrate, a first semiconductor chip disposed on the redistribution substrate, a connection substrate disposed on the redistribution substrate, the connection substrate surrounding the first semiconductor chip in a plan view of the device, and an inductor structure situated within a first region of the connection substrate and electrically connected to the first semiconductor chip through the redistribution substrate, wherein the second package includes at least one outer terminal electrically connected to the first package, and in which the outer terminal is disposed on a second region of the connection substrate, and the first region and the second region are spaced apart from each other in the plan view of the device.

According to another aspect of the inventive concept, there are also provided a semiconductor package and a semiconductor device including the same, wherein the package comprises: a redistribution substrate, a connection substrate disposed on the redistribution substrate, the connection substrate having a hole extending therethrough, a first semiconductor chip disposed on the redistribution substrate within the hole of the connection substrate, and an inductor structure situated within a first region of the connection substrate and electrically connected to the first semiconductor chip through the redistribution substrate, and in which a bottom surface of the first semiconductor chip and a bottom surface of the connection substrate are in contact with a top surface of the redistribution substrate.

According to yet another aspect of the inventive concept, there are provided a semiconductor package and a semiconductor device including the same, wherein the package comprises: a redistribution substrate, a connection substrate disposed on the redistribution substrate, the connection substrate having a hole extending therethrough, a first semiconductor chip disposed on the redistribution substrate within the hole of the connection substrate, and an inductor structure situated within a first region of the connection substrate and electrically connected to the first semiconductor chip through the redistribution substrate, and in which the first semiconductor chip comprises a voltage adjustment pad which is electrically connected to the inductor structure through the redistribution substrate, the first region is adjacent to a first side surface of the first semiconductor chip, and the voltage adjustment pad is adjacent to the first side surface of the first semiconductor chip.

According to another aspect of the inventive concept, there are also provided a semiconductor package and a semiconductor device including the same, wherein the package comprises: a redistribution substrate including an insulating substrate and an internal wiring layer of conductive traces extending within the insulating substrate, a connection substrate disposed on the redistribution substrate and including an insulating member defining an opening therein extending vertically from its top surface towards the redistribution substrate, at least one inductor embedded within the insulating member, and at least one electrical connector extending vertically through the insulating member to provide an electrically conductive path from the top surface of the insulating member to the redistribution substrate, and a semiconductor chip disposed on the redistribution substrate within the opening in the insulating member and electrically connected to the wiring layer of the redistribution substrate, and in which the connection substrate has at least one first region and at least one second region, the at least one electrical connector of the connection substrate is confined to the at least one first region of the connection substrate, the at least one inductor of the connection substrate is confined to the at least one second region of the connection substrate and is electrically connected to the first semiconductor chip through the redistribution substrate, and each said at least one first region of the connection substrate is laterally spaced from each said at least one second region of the connection substrate in a plan view of the package such that a footprint of the at least one inductor does not overlap a footprint of the at least one electrical connector of the connection substrate.

BRIEF DESCRIPTION OF THE DRAWINGS

The inventive concept will be more clearly understood from the following brief description of non-limiting examples thereof taken in conjunction with the accompanying drawings.

FIGS. 6A, 7A, 8A, 9A, and 10A are sectional views taken along line I-I' of FIG. 5 and FIGS. 6B, 7B, 8B, 9B, and 10B are sectional views taken along line II-II' of FIG. 5.

It should be noted that these figures are intended to illustrate the general characteristics of methods, structure and/or materials utilized in certain examples and to supplement the written description provided below. These drawings are not, however, to scale and may not precisely reflect the precise structural or performance characteristics of any given example, and should not be interpreted as defining or limiting the range of values or properties encompassed by examples. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Figure 1:
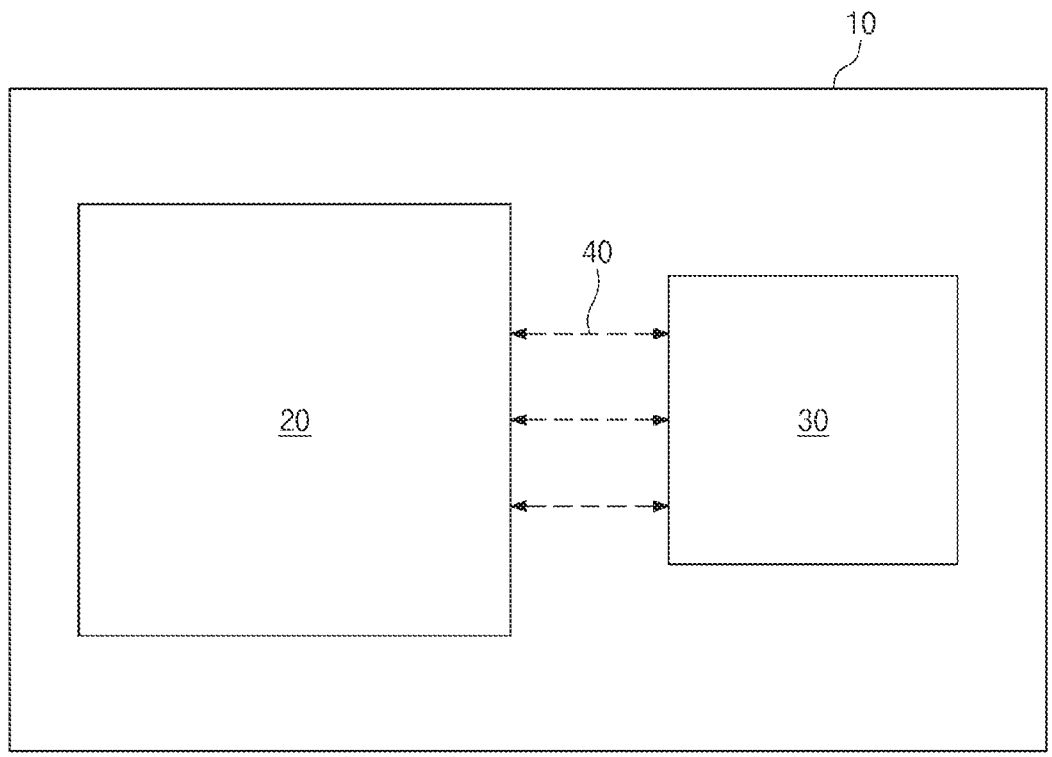
FIG. 1 is a plan view illustrating an electronic device, in which a semiconductor package according to some examples of the inventive concept is provided.

FIG. 1 is a plan view illustrating an electronic device, in which a semiconductor package according to some examples of the inventive concept is provided.

Referring to FIG. 1, a semiconductor package 20 and a power management device 30 may be provided on a board 10. The board 10 may be configured to provide at least one electrical path 40 connecting the semiconductor package 20 to the power management device 30. As an example, the board 10 may be a printed circuit board (PCB). The power management device 30 may be configured to supply electric power to the semiconductor package 20. The power management device 30 may be any of the power management devices known per se in the art and is not particularly limited. An example of the semiconductor package 20 will be described below.

Figure 2:
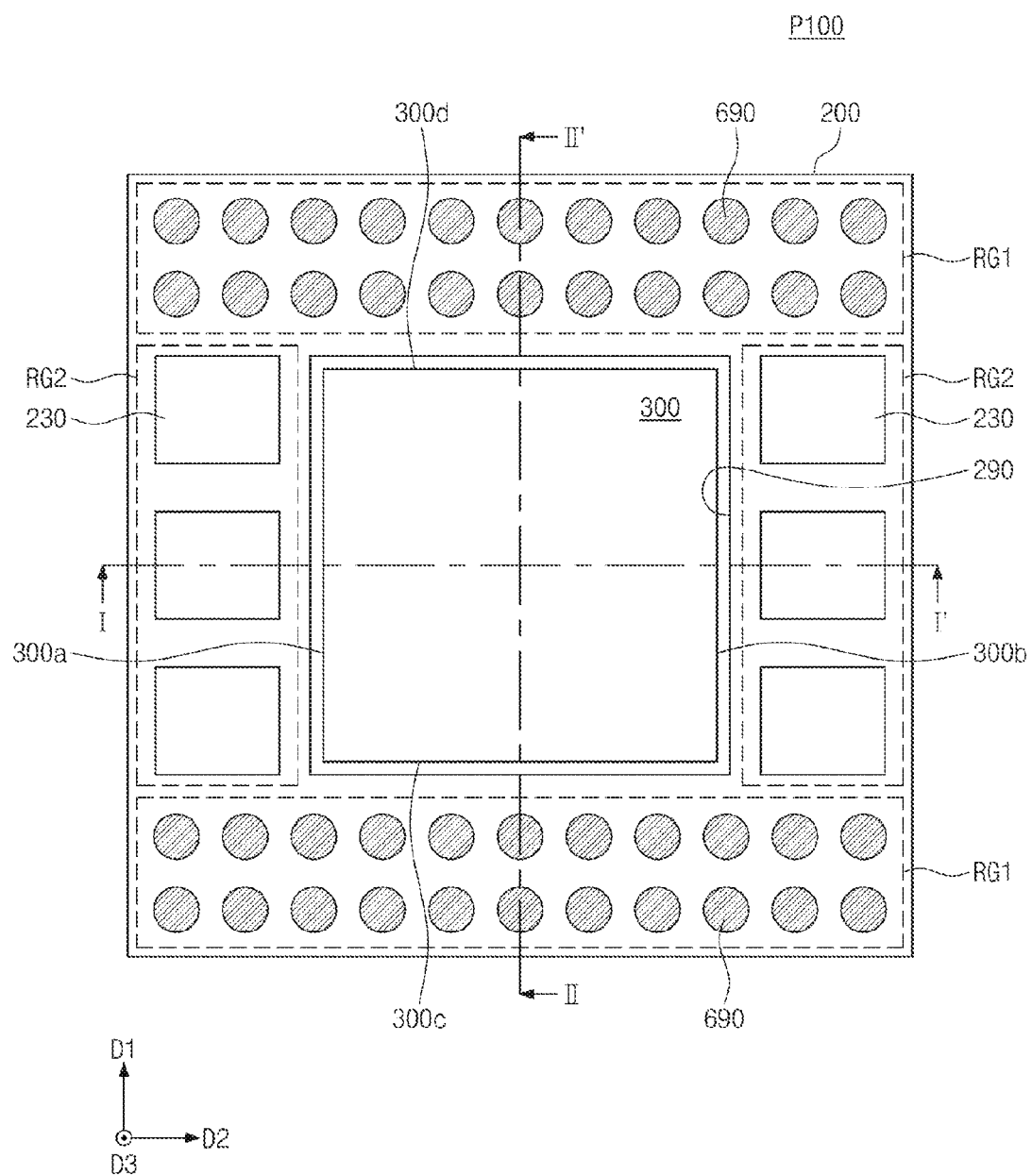
FIG. 2 is a plan view illustrating a semiconductor package or a first package, according to some examples of the inventive concept.
Figure 3A:
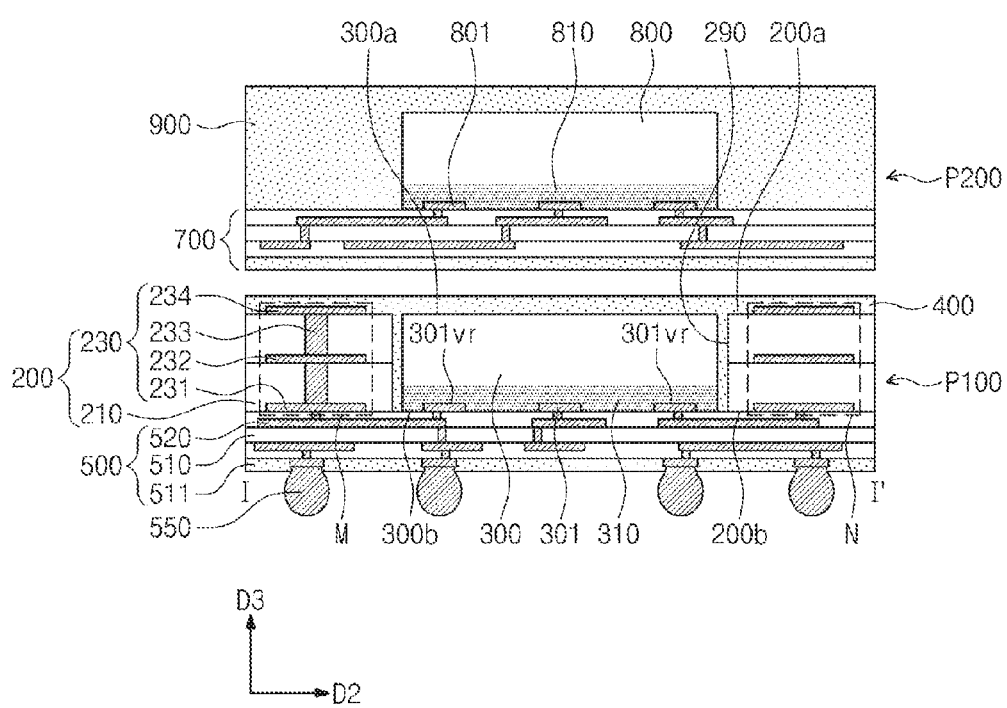
FIGS. 3A and 3B are sectional views taken along lines I-I' and II-II' respectively, of FIG. 2.
Figure 3B:
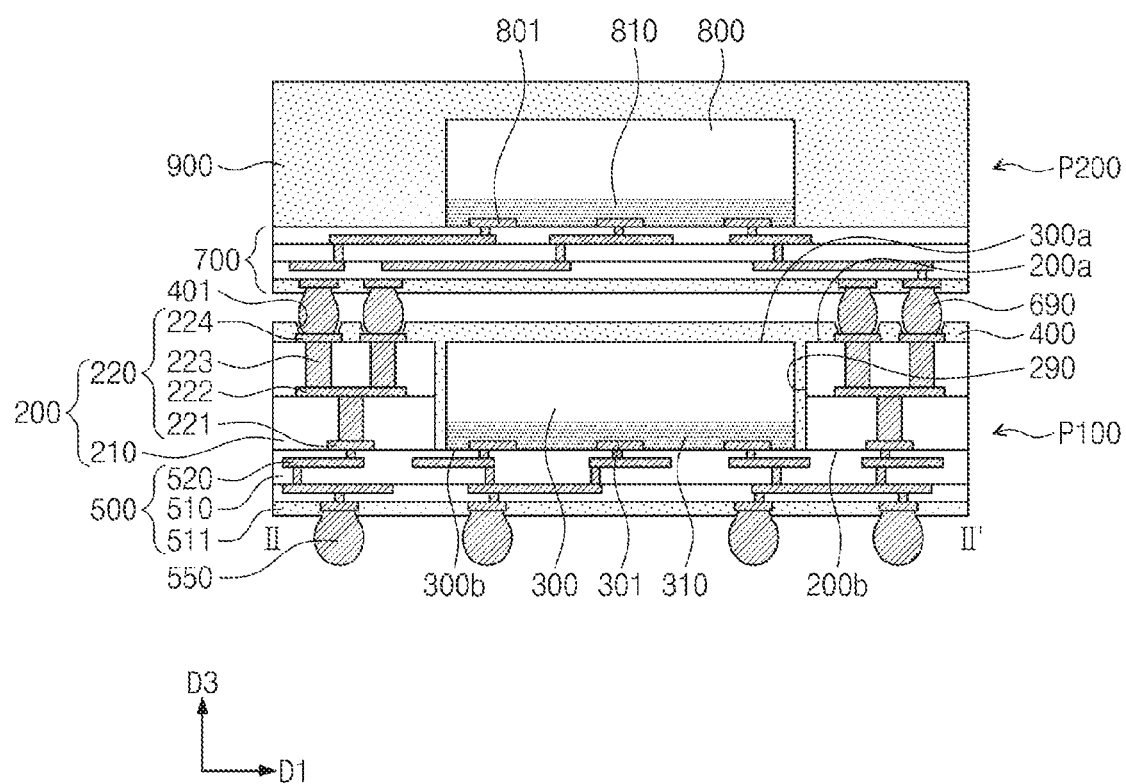
Figure 4A:
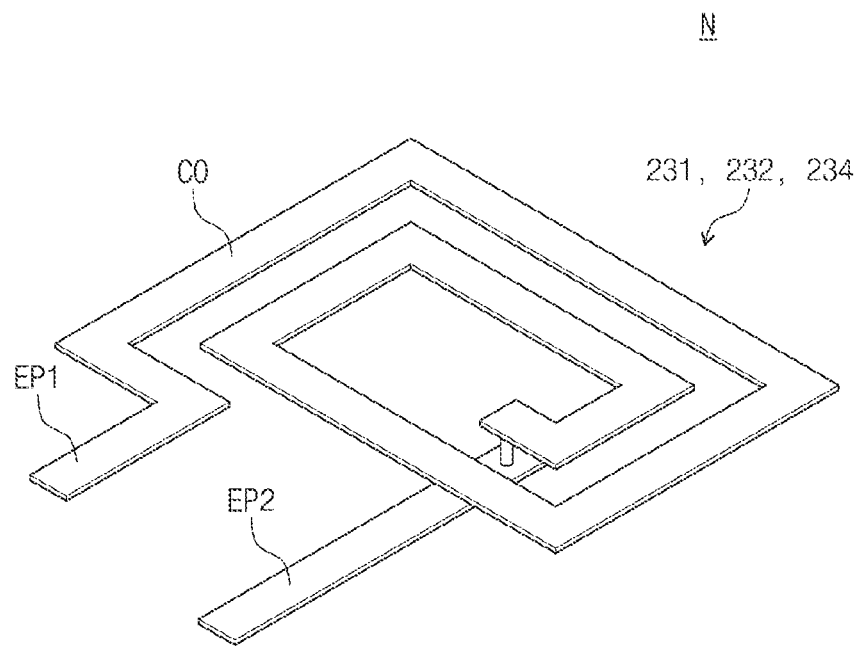
FIG. 4A is a perspective view illustrating an example of an inductor provided on the package in region N of FIG. 3A.
Figure 4B:
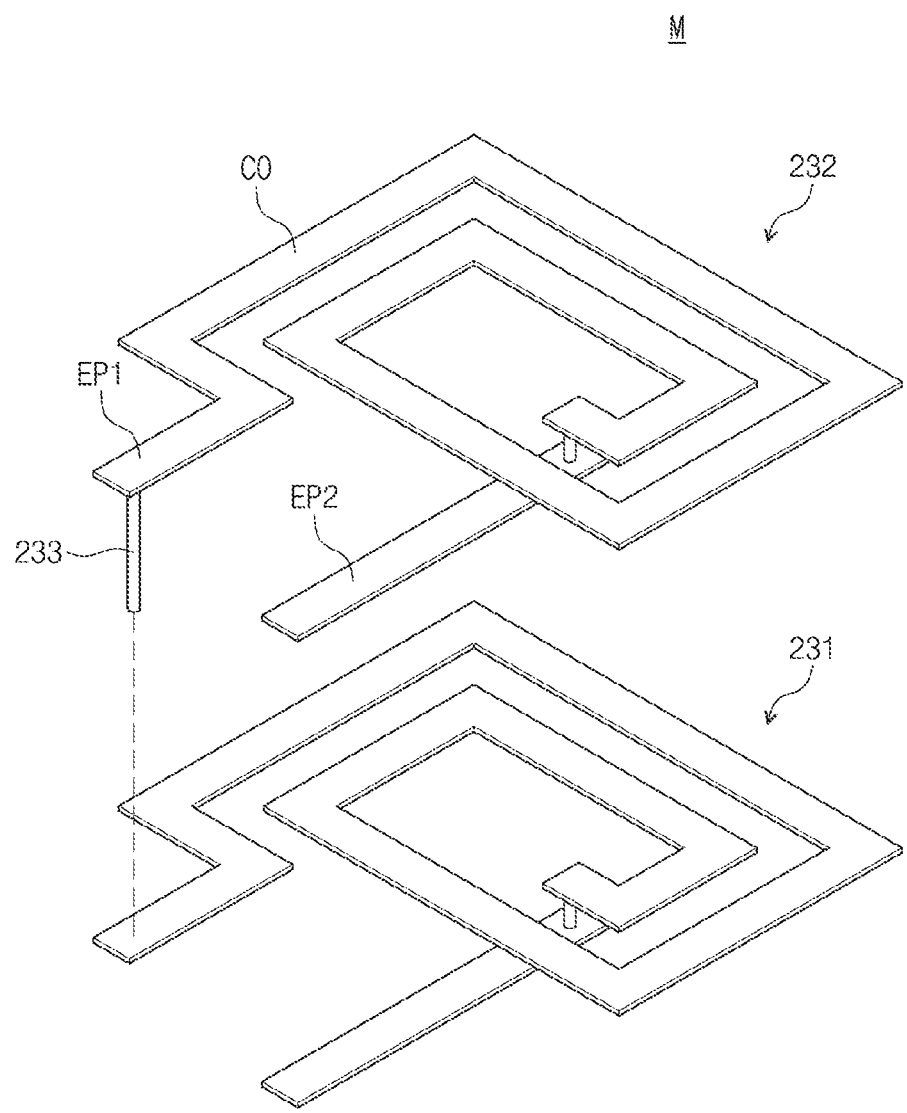
FIG. 4B is a perspective view illustrating an example of an inductor provided on the package in region M shown in FIG. 3A.

FIG. 2 is a plan view illustrating a semiconductor package or a first package, according to some examples of the inventive concept. FIGS. 3A and 3B are sectional views taken along lines I-I' and II-II', respectively, of FIG. 2. FIG. 4A is a perspective view illustrating an example of an inductor provided in a region of the device designated by reference character N in FIG. 3A. FIG. 4B is a perspective view illustrating an example of an inductor provided in a region of the device designated by reference character M in FIG. 3A.

Referring to FIGS. 2, 3A, and 3B, a second package P200 may be stacked on a first package P100. The first package P100 may include a redistribution substrate 500, a connection substrate 200, a first semiconductor chip 300, a first mold layer 400, and lower outer terminals 550. The second package P200 may include a package substrate 700, a second semiconductor chip 800, a second mold layer 900, and upper outer terminals 690. The connection substrate 200 and the first semiconductor chip 300 may be provided on the redistribution substrate 500. The redistribution substrate 500 may have a thickness that is less than that of the connection substrate 200. The second semiconductor chip 800 may be provided on the package substrate 700.

The connection substrate 200 may have a second surface 200b facing a top surface of the redistribution substrate 500 and a first surface 200a opposite to the second surface 200b. The first semiconductor chip 300 may have a second surface 300b facing the top surface of the redistribution substrate 500 and a first surface 300a opposite to the second surface 300b. The second surface 200b of the connection substrate 200 and the second surface 300b of the first semiconductor chip 300 may be in contact with the top surface of the redistribution substrate 500. The second surface 200b of the connection substrate 200 may be positioned at the same level as the second surface 300b of the first semiconductor chip 300, i.e., the second surface 200b of the connection substrate 200 may be coplanar with the second surface 300b of the first semiconductor chip 300. As an example, the first surface 200a of the connection substrate 200 may be positioned at the same level as the first surface 300a of the first semiconductor chip 300. That is, the first surface 200a of the connection substrate 200 may be coplanar with the first surface 300a of the first semiconductor chip 300. In certain examples, the first surface 200a of the connection substrate 200 may be positioned at a level different from that of the first surface 300a of the first semiconductor chip 300.

The redistribution substrate 500 may include insulating layers 510 which together may be considered as an insulating substrate, conductive patterns 520, and a protection layer 511. The conductive patterns 520 may include conductive lines or "traces" which are provided at an interface(s) between respective ones of the insulating layers 510, vias which are used to vertically connect the conductive lines to each other, and outer pads which are provided at a lower portion of the redistribution substrate 500. The lower outer terminals 550 may be provided on a bottom surface of the redistribution substrate 500 and may be connected to the outer pads. As an example, each of the lower outer terminals 550 may be a solder ball or a solder bump. The conductive patterns 520 of the redistribution substrate 500 may electrically connect the first semiconductor chip 300, the connection substrate 200, and the lower outer terminals 550 to each other.

The protection layer 511 may be provided on the bottom surface of the redistribution substrate 500 to cover the outer pads. The protection layer 511 may be provided to partially cover the lower outer terminals 550. The protection layer 511 may include an insulating polymer (e.g., an epoxy).

Referring to FIG. 2, a hole 290 may extend through the connection substrate 200. The first semiconductor chip 300 may be provided in the hole 290 of the connection substrate 200. When viewed in plan, the connection substrate 200 may surround the first semiconductor chip 300. The first semiconductor chip 300 may have a first sidewall 300a (or simply "side" as may be used hereinafter), a second sidewall 300b, a third sidewall 300c, and a fourth sidewall 300d. The first and second sidewalls 300a and 300b may extend in a first direction D1 and may be opposite to each other. The third and fourth sidewalls 300c and 300d may extend in a second direction D2 crossing the first direction D1 and may be opposite to each other. The hole 290 may be defined by inner sidewalls of the connection substrate 200, and the inner sidewalls of the connection substrate 200 may face the first to fourth sidewalls 300a, 300b, 300c, and 300d of the first semiconductor chip 300.

When viewed in plan, the connection substrate 200 may include first regions RG1 that are adjacent to the third and fourth sidewalls 300c and 300d of the first semiconductor chip 300. Also, the connection substrate 200 may include second regions RG2 that are adjacent to the first and second sidewalls 300a and 300b of the first semiconductor chip 300. The first regions RG1 may be spaced apart from (i.e., not overlapped with) the second regions RG2. For example, the first regions RG1 may be spaced apart from each other in the first direction D1, with the first semiconductor chip 300 interposed therebetween. The second regions RG2 may be spaced apart from each other in the second direction D2, with the first semiconductor chip 300 interposed therebetween. The second regions RG2 may be interposed between the first regions RG1 as spaced therefrom in the first direction D1.

Referring back to FIGS. 2, 3A, and 3B, the connection substrate 200 may include base layers 210 which together may be considered as an insulating bases substrate, conductive structures 220 integral with the base layers 210, and inductor structures 230 integral with the base layers 210. As an example, the connection substrate 200 may be a printed circuit board. The base layers 210 may include a plurality of stacked insulating layers. The conductive structures 220 may be locally provided in the first regions RG1 of the connection substrate 200, and the inductor structures 230 may be locally provided in the second regions RG2 of the connection substrate 200.

Therefore, the first region(s) RG1 of the connection substrate 200 is (or are collectively) laterally spaced from the second region(s) RG2 of the connection substrate 200 in a plan view of the package such that the footprint of the inductor structures 230 does not overlap the footprint of the conductive structures 220.

The conductive structures 220 may include lower pads 221, wire patterns 222, first vias 223, and upper pads 224. The lower pads 221 may be provided on the second surface 200b of the connection substrate 200, and the upper pads 224 may be provided on the first surface 200a of the connection substrate 200. The first vias 223 may vertically connect the lower pads 221, the wire patterns 222, and the upper pads 224. In other words, the upper pads 224 may be electrically connected to the lower pads 221 through the wire patterns 222 and the first vias 223. The upper pads 224 may be locally provided on the first regions RG1, but not on the second regions RG2. The upper outer terminals 690 may be provided on the upper pads 224.

The inductor structures 230 may include inductors 231, 232, and 234, which are used to adjust a voltage, and second vias 233. As an example, the inductors 231, 232, and 234 may include a first inductor 231, a second inductor 232, and a third inductor 234 that are vertically stacked. The first inductor 231 may be provided at the same level as the lower pad 221, the second inductor 232 may be provided at the same level as the wire pattern 222, and the third inductor 234 may be provided at the same level as the upper pad 224. Here, the term "provided at the same level" as used in connection with respective elements may refer to a case in which bottom surfaces of the elements are coplanar (i.e., the elements are formed on the same planar surface) or a case in which bottom and top surfaces of the elements are respectively coplanar (i.e., the elements are formed on the same planar surface and have substantially the same thicknesses).

Referring to FIG. 3A, the first to third inductors 231, 232, and 234 may be vertically connected to each other through the second vias 233 in the region M. In other words, the first to third inductors 231, 232, and 234 may be connected in series to each other in the region M. By contrast, in the region N, the first to third inductors 231, 232, and 234 may not be connected in series to each other. The number of the stacked inductors is not limited to that (three) of the example illustrated in FIG. 3A.

The inductor structures 230 may be configured to allow the electric power supplied from the power management device 30 of FIG. 1 to be supplied to the first and second semiconductor chips 300 and 800 at voltage levels required by the first and second semiconductor chips 300 and 800. The inductor structures 230 may be electrically connected to the first semiconductor chip 300 through the redistribution substrate 500. The first semiconductor chip 300 may include first chip pads 301, and the first chip pads 301 may include voltage adjustment pads 301vr that are electrically connected to the inductor structures 230. The voltage adjustment pads 301vr may be connected to a voltage adjustment part (circuit) of the first semiconductor chip 300.

When viewed in plan, the voltage adjustment pads 301vr may be provided adjacent to the first and second sidewalls 300a and 300b of the first semiconductor chip 300. When viewed in plan, the inductor structures 230 may be provided adjacent to the first and second sidewalls 300a and 300b of the first semiconductor chip 300. Accordingly, it may be possible to minimize a length of an electrical path between the inductor structures 230 and the first semiconductor chip 300 and thereby to provide a high degree of efficiency in the transmitting of electric power between the inductor structures 230 and the first semiconductor chip 300.

According to some examples of the inventive concept having the arrangement of FIG. 1, inductors are disposed in (i.e., integrated with) the semiconductor package 20 as opposed to being disposed in the board 10. This may make it possible to minimize the size of the board 10 and to simplify the electrical paths 40 between the semiconductor package 20 and the power management device 30. The connection substrate 200 may have a thickness that is larger than that of the redistribution substrate 500, and thus, each of the inductors 231, 232, and 234 of the connection substrate 200 may have a size or a thickness that is larger than that of each of the conductive patterns 520 in the redistribution substrate 500. In some examples, the inductors 231, 232, and 234, which are provided as integral parts of the connection substrate 200, may be configured to have relatively low resistance and relatively high inductance.

FIG. 4A exemplarily illustrates one of the inductors 231, 232, and 234 which is provided in the base layers 210 and in the region N of FIG. 3A. At least one of the inductors 231, 232, and 234 may include a conductive coil CO, a first conductive extension EP1, and a second conductive extension EP2. The conductive coil CO may be configured to allow the inductor 231, 232, or 234 to have a specific value of inductance. The first and second conductive extensions EP1 and EP2 may be respectively used as input and output terminals of the inductor for inputting and outputting signals to and from the inductor.

The conductive coil CO and the first conductive extension EP1 may be positioned at the same level. The second conductive extension EP2 may be positioned at a level different from those of the conductive coil CO and the first conductive extension EP1. As an example, the second conductive extension EP2 may be positioned at a level lower than that of the conductive coil CO and the first conductive extension EP1. The first and second conductive extensions EP1 and EP2 may be spaced apart from each other. The first and second conductive extensions EP1 and EP2 may be connected to the end portions, respectively, of the conductive coil CO. Each of the first and second conductive extensions EP1 and EP2 may be a linear strip of conductive material extending longitudinally in a direction away from the conductive coil CO.

FIG. 4B exemplarily illustrates one of the inductors 231, 232, and 234 which is provided in the base layers 210 and in the region M of FIG. 3A. The second via 233 may be connected to the first conductive extension EP1 of the second inductor 232. The first inductor 231 may be provided below the second via 233 and may be connected to the second via 233. That is, the first and second inductors 231 and 232 may be connected in series to each other in a vertical direction.

In some examples, the inductors 231, 232, and 234 may be configured to have the structure illustrated in FIGS. 4A and 4B, but the inventive concept is not limited thereto.

Referring back to FIGS. 2, 3A, and 3B, the first semiconductor chip 300 may further include a first circuit layer 310 adjacent to the second surface 300b, and here, the first chip pads 301 may be provided on the first circuit layer 310. The first circuit layer 310 may include transistors which are formed on a silicon substrate of the first semiconductor chip 300, and interconnection lines which are formed on the transistors. The first circuit layer 310 may be electrically connected to the redistribution substrate 500 through the first chip pads 301. The first semiconductor chip 300 may be mounted on the redistribution substrate 500 in a flip-chip bonding manner. The first semiconductor chip 300 may be, for example, a processor chip.

The first mold layer 400 may cover the connection substrate 200 and the first semiconductor chip 300. For example, the first mold layer 400 may cover top surfaces of the connection substrate 200 and the first semiconductor chip 300. Also, the first mold layer 400 may fill a gap between the connection substrate 200 and the first semiconductor chip 300. In other words, the first mold layer 400 may fill a remainder of the hole 290 of the connection substrate 200. The first mold layer 400 may include an insulating polymer (e.g., an epoxy). The first mold layer 400 may have openings 401 exposing the upper pads 224. The first mold layer 400 may also cover the third inductor 234.

The first package P100 and the second package P200 may be electrically connected to each other through the upper outer terminals 690. The upper outer terminals 690 may be locally provided on the upper pads 224, and thus, the upper outer terminals 690 may be locally provided on only the first regions RG1 of the connection substrate 200. For example, the upper outer terminals 690 may not be provided on the second regions RG2. As an example, each of the upper outer terminals 690 may be a solder ball or a solder bump.

The package substrate 700 may include insulating layers, conductive patterns, and a protection layer. The package substrate 700 may electrically connect the second semiconductor chip 800 to the upper outer terminals 690. In some examples, the package substrate 700 may have a structure similar to that of the redistribution substrate 500 described above.

The second semiconductor chip 800 may include a second circuit layer 810 and second chip pads 801 thereon. The second circuit layer 810 may include transistors which are formed on a silicon substrate of the second semiconductor chip 800, and interconnection lines which are formed on the transistors. The second circuit layer 810 and the package substrate 700 may be electrically connected to each other through the second chip pads 801. The second semiconductor chip 800 may be mounted on the package substrate 700 in a flip-chip bonding manner. In some examples, the second semiconductor chip 800 may be, for example, a memory chip. Although not illustrated, in certain examples, a plurality of the second semiconductor chips 800 may be provided. The plurality of second semiconductor chips 800 may be vertically stacked, or two-dimensionally arranged, on the package substrate 700.

The second mold layer 900 may cover the package substrate 700 and the second semiconductor chip 800. The second mold layer 900 may include an insulating polymer (e.g., an epoxy).

Figure 5:
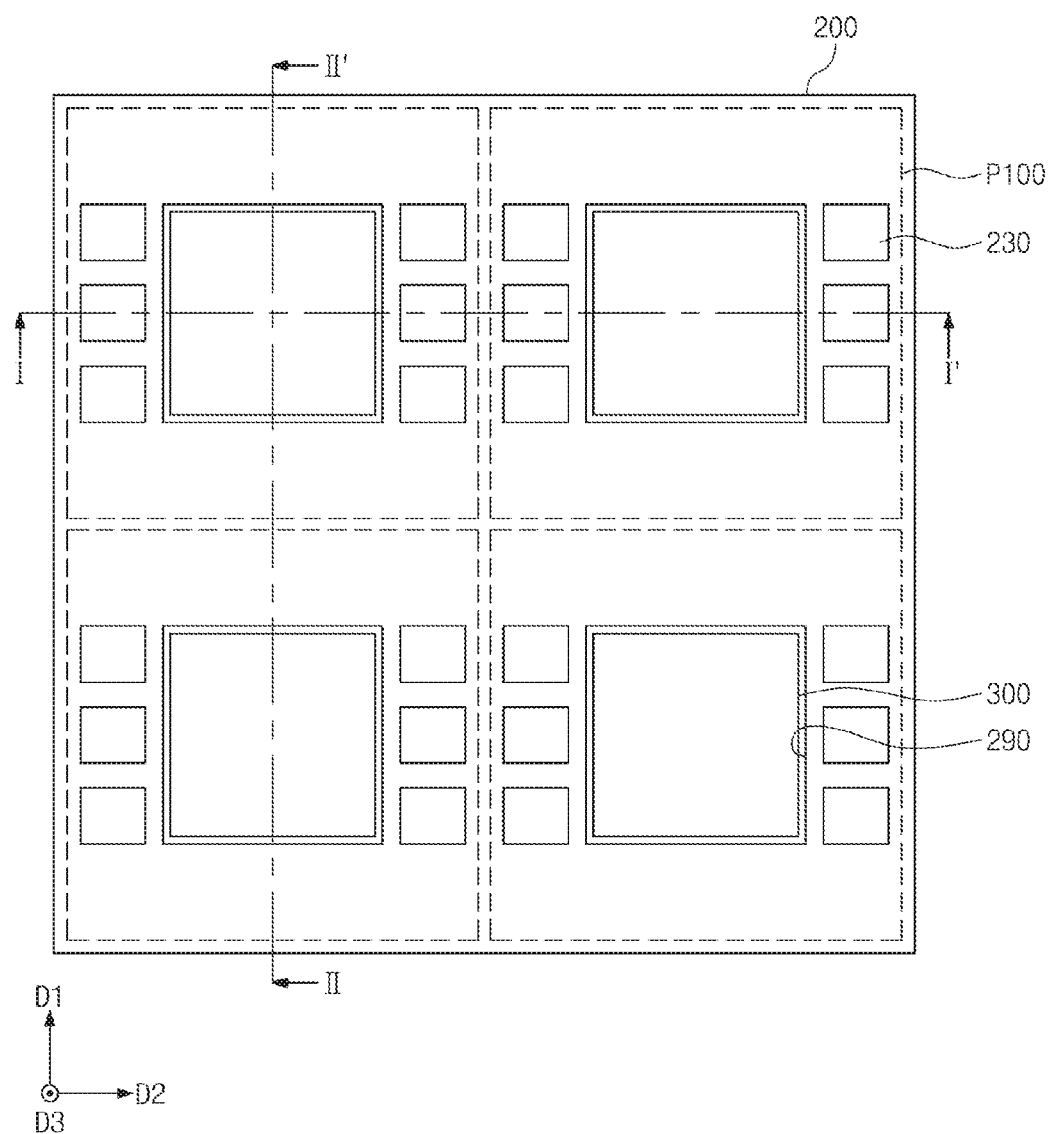
FIG. 5 is a layout of semiconductor packages during the course of a method of fabricating a semiconductor package (s), according to some examples of the inventive concept.

FIGS. 5-10B illustrate a method of fabricating a semiconductor package, according to some examples of the inventive concept. FIG. 5 is a plan view of a layout of packages during the course of their manufacture. FIGS. 6A, 7A, 8A, 9A, and 10A are sectional views taken along line I-I' of FIG. 5 and FIGS. 6B, 7B, 8B, 9B, and 10B are sectional views taken along line II-II' of FIG. 5.

Referring to FIGS. 5, 6A, and 6B, the connection substrate 200 may be provided on a carrier substrate 100. The connection substrate 200 may be attached to the carrier substrate 100 by an adhesive layer 150. The second surface 200b of the connection substrate 200 may be in contact with the adhesive layer 150. Holes 290 may be formed to extend through the connection substrate 200. The connection substrate 200 may include the base layers 210, the conductive structures 220 provided in the base layers 210, and the inductor structures 230 provided in the base layers 210. In some examples, the connection substrate 200 may have substantially the same structure as the connection substrate 200 described with reference to FIGS. 2, 3A, and 3B.

Figure 7A:
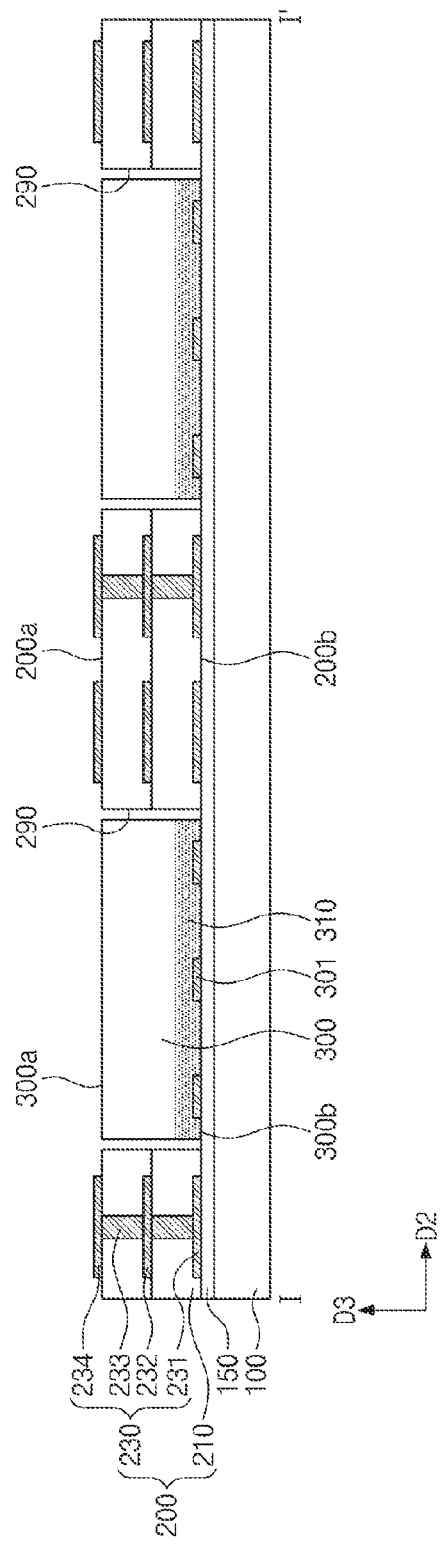
Figure 7B:
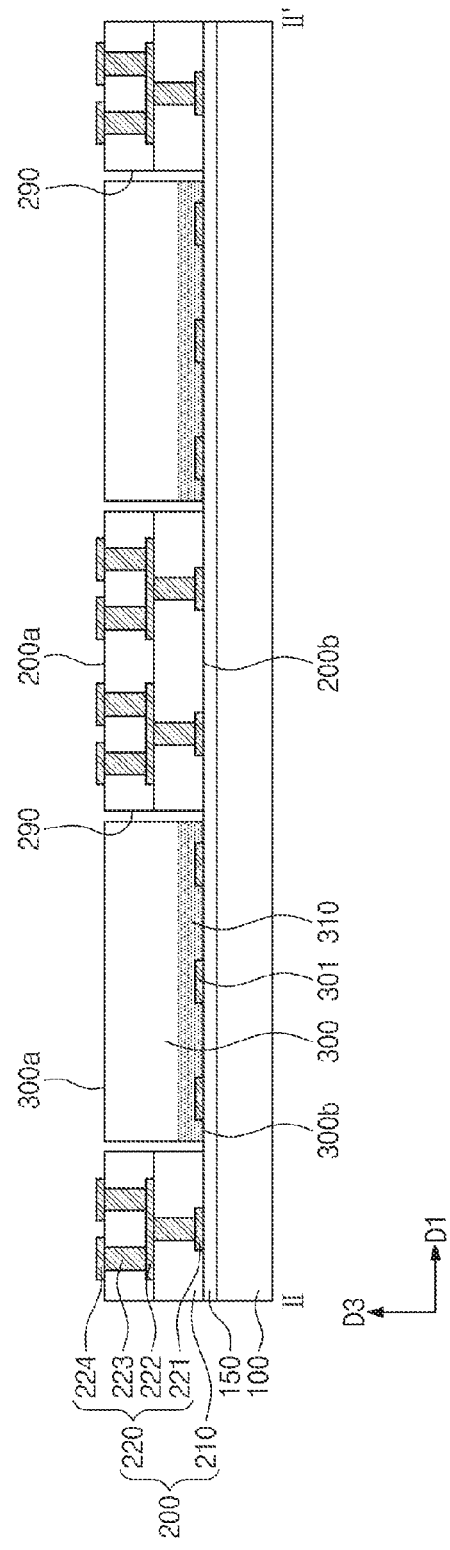

Referring to FIGS. 5, 7A, and 7B, first semiconductor chips 300 may be provided on the carrier substrate 100. Each of the first semiconductor chips 300 may be provided in a corresponding one of the holes 290 of the connection substrate 200. Each of the first semiconductor chips 300 may include the first circuit layer 310 provided in the second surface 300b, and the first chip pads 301 provided on the first circuit layer 310. The second surface 300b of the first semiconductor chip 300 may be in contact with the adhesive layer 150. Each of the first semiconductor chips 300 may have substantially the same structure as the first semiconductor chip 300 described with reference to FIGS. 2, 3A, and 3B.

Referring to FIGS. 5, 8A, and 8B, the first mold layer 400 may be formed on the carrier substrate 100. The first mold layer 400 may be formed to cover a top surface of the connection substrate 200 and top surfaces of the first semiconductor chips 300. Also, the first mold layer 400 may be formed to fill a gap between the connection substrate 200 and the first semiconductor chip 300. In other words, the first mold layer 400 may fill a remainder of the hole 290 of the connection substrate 200. The first mold layer 400 may include an insulating polymer (e.g., an epoxy). The openings 401 may be formed at an upper portion of the first mold layer 400 to expose the upper pads 224.

Subsequently, as depicted by a dotted line, the carrier substrate 100 and the adhesive layer 150 may be removed. As a result, the second surface 300b of the first semiconductor chip 300 and the second surface 200b of the connection substrate 200 may be exposed.

Referring to FIGS. 5, 9A, and 9B, the redistribution substrate 500 may be provided on the second surface 300b of the first semiconductor chip 300 and the second surface

200b of the connection substrate 200. The providing of the redistribution substrate 500 may include forming the insulating layers 510 and conductive patterns on the second surface 300b of the first semiconductor chip 300 and the second surface 200b of the connection substrate 200, forming the protection layer 511, and forming the lower outer terminals 550. The redistribution substrate 500 may have a thickness that is less than that of the connection substrate 200. The redistribution substrate 500 may be configured to have substantially the same features as those of the examples described with reference to FIGS. 2, 3A, and 3B.

Referring to FIGS. 5, 10A, and 10B, a cutting process may be performed to form first packages P100. Each of the first packages P100 may include at least one first semiconductor chip 300.

Referring back to FIGS. 2, 3A, and 3B, the second package P200 may be mounted on the first package P100. The second package P200 may include the package substrate 700, the second semiconductor chip 800, the second mold layer 900, and the upper outer terminals 690. For example, the upper outer terminals 690 of the second package P200 may be provided on and connected to the upper pads 224 of the first regions RG1 of the connection substrate 200. The second package P200 may have substantially the same features as the package P200 of the previously described examples.

Figure 11:
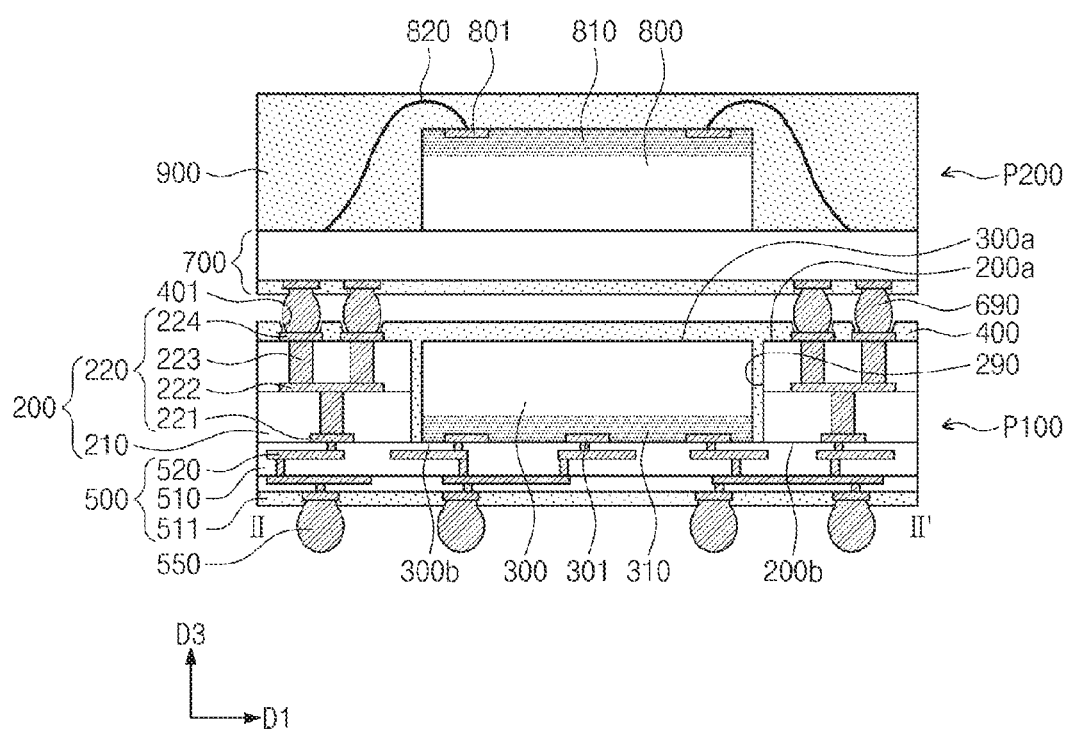
FIG. 11 is a sectional view that is taken along line II-II' of FIG. 2 and is provided to illustrate a semiconductor package according to other examples of the inventive concept.

FIG. 11 is a sectional view that is taken along line II-II' of FIG. 2 and is provided to illustrate other examples of a semiconductor package according to the inventive concept. For concise description, an element previously described with reference to FIGS. 2, 3A, 3B, and 4 may be identified by a similar or identical reference number to avoid the need for duplicating the description thereof.

Referring to FIGS. 2 and 11, the second semiconductor chip 800 may be mounted on the package substrate 700. The second semiconductor chip 800 may be electrically connected to the package substrate 700 through bonding wires 820. The second circuit layer 810 and the second chip pads 801 of the second semiconductor chip 800 may be provided adjacent to a top surface of the second semiconductor chip 800. The bonding wires 820 may contact the second chip pads 801. Although not illustrated, in certain examples, a plurality of the second semiconductor chips 800 may be provided. The plurality of second semiconductor chips 800 may be vertically stacked, or two-dimensionally arranged, on the package substrate 700.

Figure 12:
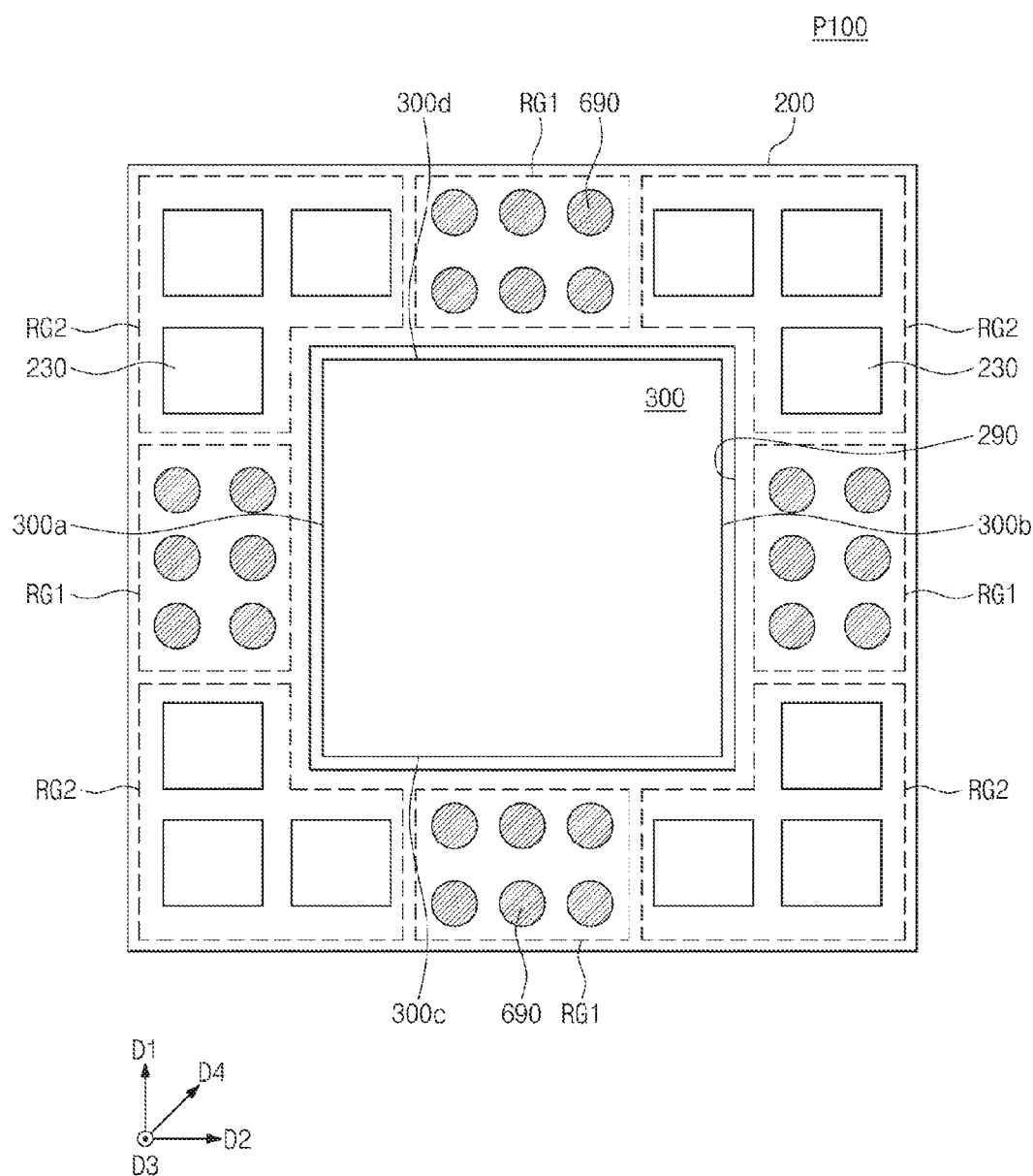
FIG. 12 is a plan view illustrating a semiconductor package or a first package, according to some other examples of the inventive concept.

FIG. 12 is a plan view illustrating yet some other examples a semiconductor package or a first package, according to the inventive concept. For concise description, an element previously described with reference to FIGS. 2, 3A, 3B, and 4 may be identified by a similar or identical reference number to avoid the need for duplicating the description thereof.

Referring to FIG. 12, the first regions RG1 of the connection substrate 200 may be adjacent to the first to fourth sidewalls 300a, 300b, 300c, and 300d of the first semiconductor chip 300. Each of the first regions RG1 may be adjacent to a center of a corresponding one of the first to fourth sidewalls 300a, 300b, 300c, and 300d. The second regions RG2 may be positioned at the remaining regions, other than the first regions RG1, of the connection substrate 200. Each of the second regions RG2 may be interposed between an adjacent pair of the first regions RG1. Each of the first regions RG1 may be interposed between an adjacent pair of the second regions RG2. In other words, the first and second regions RG1 and RG2 may be alternately arranged along the circumference of the first semiconductor chip 300.

A pair of the first regions RG1 may be spaced apart from each other in the first direction D1, with the first semiconductor chip 300 interposed therebetween. Another pair of the first regions RG1 may be spaced apart from each other in the second direction D2, with the first semiconductor chip 300 interposed therebetween. A pair of the second regions RG2 may be spaced apart from each other in a fourth direction D4, with the first semiconductor chip 300 interposed therebetween. The fourth direction D4 may be a direction crossing, i.e., oblique to, both of the first and second directions D1 and D2.

The conductive structures 220 and the upper outer terminals 690 thereon may be provided in the first regions RG1, and the inductor structures 230 may be provided in the second regions RG2.

Figure 13:
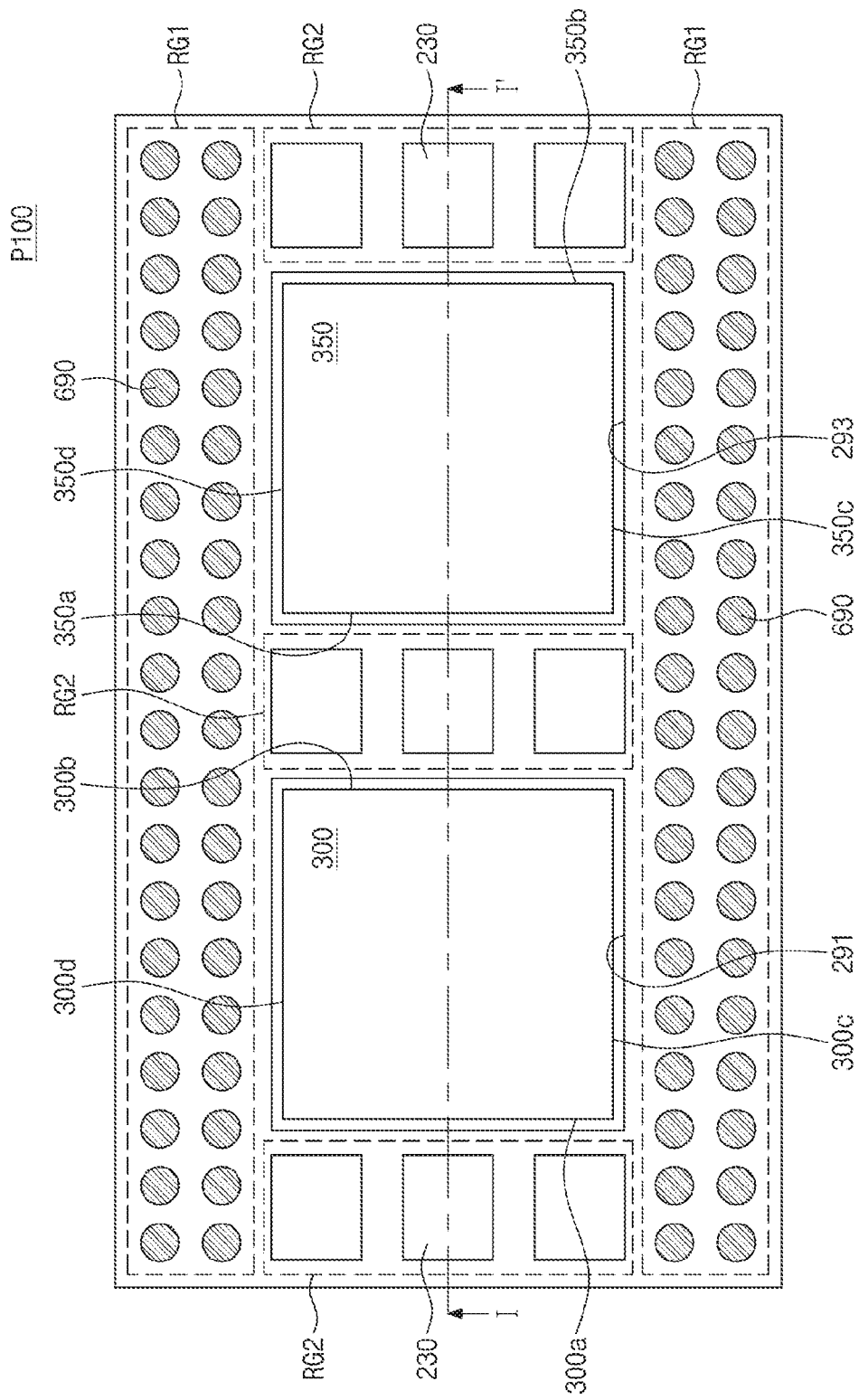
FIG. 13 is a plan view illustrating a semiconductor package or a first package, according to still some other examples of the inventive concept.
Figure 14:
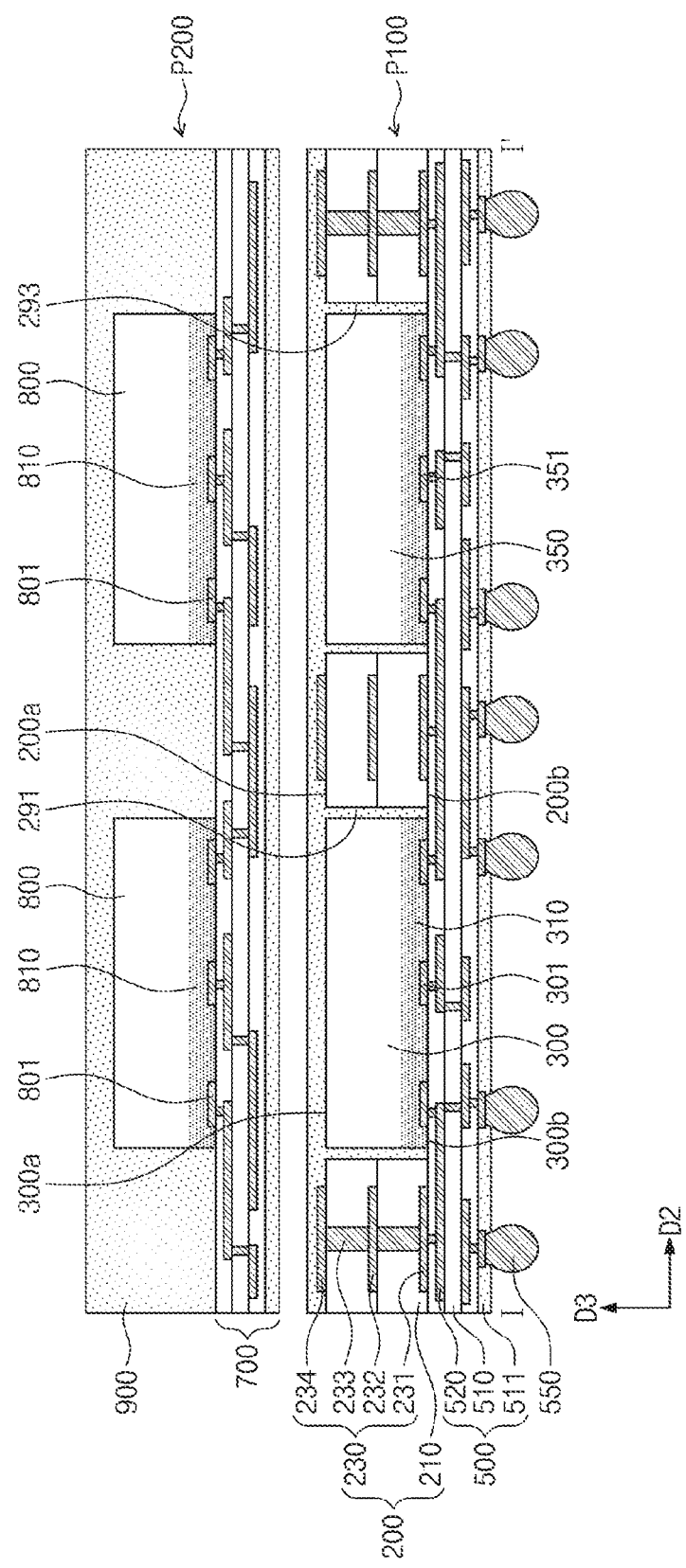
FIG. 14 is a sectional view taken along line I-I' of FIG. 13.

FIG. 13 is a plan view illustrating some other examples of a semiconductor package or a first package, according to of the inventive concept. FIG. 14 is a sectional view taken along line I-I' of FIG. 13. For concise description, an element previously described with reference to FIGS. 2, 3A, 3B, and 4 may be identified by a similar or identical reference number to avoid the need for duplicating the description thereof.

Referring to FIGS. 13 and 14, a first hole 291 and a second hole 293 may extend through the connection substrate 200. The first semiconductor chip 300 may be provided in the first hole 291 of the connection substrate 200, and a third semiconductor chip 350 may be provided in the second hole 293. The connection substrate 200 may surround the first and third semiconductor chips 300 and 350. The first regions RG1 and the second regions RG2 of the connection substrate 200 may be positioned adjacent to sidewalls of the first and third semiconductor chips 300 and 350, respectively.

When viewed in plan, the connection substrate 200 may surround the first and third semiconductor chips 300 and 350. The third semiconductor chip 350 may have a fifth sidewall 350a, a sixth sidewall 350b, a seventh sidewall 350c, and an eighth sidewall 350d. The fifth and sixth sidewalls 350a and 350b may extend in the first direction D1 and may be opposite to each other. The seventh and eighth sidewalls 350c and 350d may extend in the second direction D2 crossing the first direction D1 and may be opposite to each other. The connection substrate 200 may be provided in such a way that inner sidewalls defining the second hole 293 face the fifth to eighth sidewalls 350a, 350b, 350c, and 350d of the first semiconductor chip 300.

When viewed in plan, the first regions RG1 of the connection substrate 200 may be adjacent to the third and fourth sidewalls 300c and 300d of the first semiconductor chip 300 and the seventh and eighth sidewalls 350c and 350d of the third semiconductor chip 350. The second regions RG2 of the connection substrate 200 may be adjacent to the first and second sidewalls 300a and 300b of the first semiconductor chip 300 and the fifth and sixth sidewalls 350a and 350b of the third semiconductor chip 350.

Similar to the first semiconductor chip 300, the third semiconductor chip 350 may be mounted on the redistribution substrate 500 in a flip-chip bonding manner. The third semiconductor chip 350 and the redistribution substrate 500 may be electrically connected to each other through the third chip pads 351 of the third semiconductor chip 350. The third semiconductor chip 350 may be electrically connected to the inductor structures 230 through the redistribution substrate 500. As an example, the third semiconductor chip 350 may be the power management device 30 of FIG. 1. In some examples, the board 10 of FIG. 1 along with the semiconductor package 20 and the power management device 30 thereon may be integrated in the form of a single package.

The second package P200 may be stacked on the first package P100. The second package P200 may include a plurality of second semiconductor chips 800. The second semiconductor chips 800 may be of the same kind. For example, the second semiconductor chips 800 may be memory chips.

According to some examples of the inventive concept, an inductor structure is provided in a semiconductor package, and this may make it possible to transmit electric power between the inductor structure and a semiconductor chip with a high degree of efficiency. In the semiconductor package according to some examples of the inventive concept, the inductor structure may have a relatively low resistance and a relatively high inductance.

Although examples of the inventive concept have been particularly shown and described, it will be understood by one of ordinary skill in the art that variations in form and detail may be made thereto without departing from the true spirit and scope of the inventive concept as defined by the attached claims.

What is claimed is:

1. A semiconductor device, comprising:
a first package including:
a redistribution substrate,
a first semiconductor chip disposed on the redistribution substrate,
a connection substrate disposed on the redistribution substrate, the connection substrate surrounding the first semiconductor chip in a plan view of the device, and
an inductor structure situated within a first region of the connection substrate and electrically connected to the first semiconductor chip through the redistribution substrate; and
a second package stacked on the first package,
the second package including at least one outer terminal electrically connected to the first package,
wherein the outer terminal is disposed on a second region of the connection substrate, and
the first region and the second region are spaced apart from each other in the plan view of the device.

2. The semiconductor device of claim 1, wherein the first semiconductor chip has a first surface, and an active circuit region extending along the first surface, and
the first semiconductor chip is oriented in the device with the first surface facing the redistribution substrate.

3. The semiconductor device of claim 1, wherein the connection substrate is thicker than the redistribution substrate.

4. The semiconductor device of claim 1, wherein the inductor structure comprises a plurality of vertically stacked inductors.

5. The semiconductor device of claim 1, wherein the first region is adjacent to a side surface of the first semiconductor chip, and
the first semiconductor chip comprises a voltage adjustment pad that is adjacent to the side surface and is electrically connected to the inductor structure.

6. The semiconductor device of claim 1, wherein the first package further comprises a mold layer filling a gap between the first semiconductor chip and the connection substrate.

7. The semiconductor device of claim 1, wherein the first package further comprises a conductive structure disposed within the second region of the connection substrate,
wherein the conductive structure comprises:

a lower pad that is adjacent to a bottom surface of the connection substrate and is in contact with the redistribution substrate;
an upper pad on a top surface of the connection substrate; and
at least one wire pattern and at least one via which are interposed between the lower pad and the upper pad and electrically connect the lower pad to the upper pad.

8. The semiconductor device of claim 1, wherein the second package also includes:
a package substrate; and
a second semiconductor chip on the package substrate,
wherein the first semiconductor chip is a processor chip, and
the second semiconductor chip is a memory chip.

9. The semiconductor device of claim 1, wherein the connection substrate has a pair of the first regions and a pair of the second regions,
the first regions are spaced apart from each other in a first direction, with the first semiconductor chip interposed therebetween,
the second regions are spaced apart from each other in a second direction crossing the first direction, with the first semiconductor chip interposed therebetween.

10. The semiconductor device of claim 1, wherein the first semiconductor chip has a first side surface, a second side surface, a third side surface, and a fourth side surface,
the first and second side surfaces extend in a first direction and are opposite to each other,
the third and fourth side surfaces extend in a second direction crossing the first direction and are opposite to each other,
the first region is adjacent to the first side surface,
the second region is adjacent to the second side surface.

11. The semiconductor device of claim 1, wherein the first semiconductor chip has a first side surface, a second side surface, a third side surface, and a fourth side surface,
the first and second side surfaces extend in a first direction and are opposite to each other,
the third and fourth side surfaces extend in a second direction crossing the first direction and are opposite to each other,
a plurality of the second regions are adjacent to the first and third side surfaces, and
the first region is interposed between the second regions.

12. A semiconductor package, comprising:
a redistribution substrate;
a connection substrate disposed on the redistribution substrate, the connection substrate having a hole extending therethrough;
a first semiconductor chip disposed on the redistribution substrate within the hole of the connection substrate; and
an inductor structure situated within a first region of the connection substrate and electrically connected to the first semiconductor chip through the redistribution substrate,
wherein a bottom surface of the first semiconductor chip and a bottom surface of the connection substrate each contact a top surface of the redistribution substrate.

13. The semiconductor package of claim 12, wherein the first semiconductor chip has a bottom surface and a circuit layer extending along the bottom surface.

14. The semiconductor package of claim 12, further comprising a mold layer filling a gap between the first semiconductor chip and the connection substrate.

15. A semiconductor device comprising the semiconductor package of claim 12, and further comprising:
a package substrate disposed on the connection substrate;
an outer terminal interposed between the connection substrate and the package substrate; and
a second semiconductor chip on the package substrate,
wherein the outer terminal is spaced apart from the first region of the connection substrate.

16. A semiconductor package, comprising:
a redistribution substrate including an insulating substrate, and an internal wiring layer of conductive traces extending within the insulating substrate;
a connection substrate disposed on the redistribution substrate, the connection substrate including an insulating member having a bottom surface facing towards the redistribution substrate and a top surface facing away from the redistribution substrate and defining an opening therein extending vertically from the top surface towards the redistribution substrate, at least one inductor embedded within the insulating member, and at least one electrical connector extending vertically through the insulating member to provide an electrically conductive path from the top surface of the insulating member to the redistribution substrate; and
a semiconductor chip disposed on the redistribution substrate within the opening in the insulating member and electrically connected to the wiring layer of the redistribution substrate,
wherein the connection substrate has at least one first region and at least one second region,
the at least one electrical connector of the connection substrate is confined to the at least one first region of the connection substrate,
the at least one inductor of the connection substrate is confined to the at least one second region of the connection substrate and is electrically connected to the first semiconductor chip through the redistribution substrate, and
each said at least one first region of the connection substrate is laterally spaced from each said at least one second region of the connection substrate in a plan view of the package such that a footprint of the at least one inductor does not overlap a footprint of the at least one electrical connector of the connection substrate.

17. The semiconductor package of claim 16, wherein the semiconductor chip has a bottom surface facing towards the redistribution substrate, a top surface facing away from the redistribution substrate, first and second sides extending between the top and bottom surface and facing in opposite directions,
the at least one electrical connector of the connection substrate comprises an electrical connector that faces the first side of the semiconductor chip, and
the at least one inductor of the connection substrate comprises an inductor that faces the second side of the semiconductor chip.

18. The semiconductor package of claim 16, wherein the semiconductor chip has a rectangular bottom surface facing towards the redistribution substrate, a rectangular top surface facing away from the redistribution substrate, first, second, third and fourth sides and corners at each of which respective ones of the sides meet,
the at least one electrical connector of the connection substrate comprises an electrical connector that faces a central portion of one of the sides of the semiconductor chip located intermediate two of the corners of the semiconductor chip, and
the at least one inductor of the connection substrate comprises an inductor that lies along a plane passing through two of the corners of the semiconductor chip located diagonally across from each with respect to the rectangular top and bottom surfaces of the semiconductor chip.

19. The semiconductor package of claim 16, wherein the insulating member of the connection substrate includes a first insulating layer and a second insulating layer disposed on the first insulating layer,
said at least one electrical connector includes vias extending through the first and second insulating layers in the first region of the connection substrate, and
said at least one inductor includes a conductive trace in the form of a coil extending along an interface between the first and second insulating layers of the connection substrate and electrically insulated from the vias by the insulating member.

20. A semiconductor device comprising the semiconductor package of claim 16, further comprising:
a second semiconductor package disposed on and mounted to connection substrate,
wherein the second semiconductor package includes:
a second package substrate of the device,
a second semiconductor chip of the device disposed on one side of and mounted to the second package substrate, and
at least one outer terminal disposed on the other side of the second package substrate, disposed on the second region of the connection substrate, and electrically connected to the at least one electrical connector of the connection substrate.

* * * * *